US006043115A

United States Patent [19]
Pan

[11] Patent Number: 6,043,115
[45] Date of Patent: Mar. 28, 2000

[54] METHOD FOR AVOIDING INTERFERENCE IN A CMOS SENSOR

[75] Inventor: Jui-Hsiang Pan, Hsinchu, Taiwan

[73] Assignee: United Microelectronics Corp., Taiwan

[21] Appl. No.: 09/276,777

[22] Filed: Mar. 25, 1999

[51] Int. Cl.[7] .................... H01L 21/8238; H01L 21/00
[52] U.S. Cl. .................... 438/199; 438/197; 438/48; 438/75
[58] Field of Search ................ 438/199, 197, 438/200, 210, 27, 48, 75, 142, FOR 54, FOR 216, FOR 217

[56] References Cited

U.S. PATENT DOCUMENTS

| | | | |
|---|---|---|---|
| 4,841,348 | 6/1989 | Shizukuishi et al. | 257/440 |
| 5,420,634 | 5/1995 | Matsumoto | 348/311 |
| 5,681,760 | 10/1997 | Park | 438/158 |
| 5,945,722 | 8/1999 | Tsuei et al. | 257/440 |
| 5,986,297 | 11/1999 | Guidash et al. | 257/223 |

*Primary Examiner*—Michael Trinh
*Attorney, Agent, or Firm*—Martine Penilla & Kim, LLP

[57] ABSTRACT

A method for avoiding interference in a CMOS sensor. A substrate at least comprising a CMOS sensor, an interconnect layer and an inter-layer dielectric layer thereon is provided. A passivation layer is formed over the substrate. A photolithography and etching process is performed to remove a part of the passivation layer and a part of the inter-layer dielectric layer above a sensor region of the CMOS sensor. The sensor region is thus exposed. An oxide layer is formed on the exposed sensor region. A micro-lens is formed on the oxide layer.

13 Claims, 5 Drawing Sheets

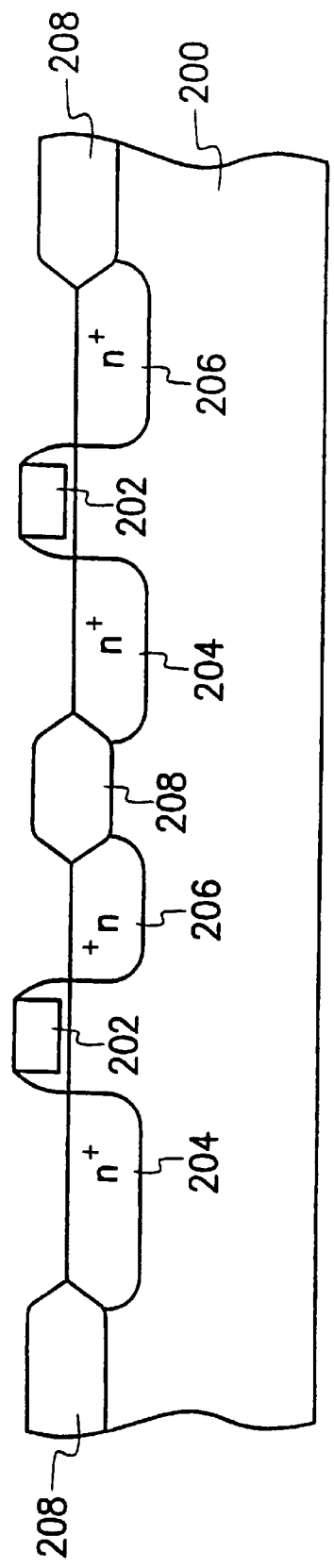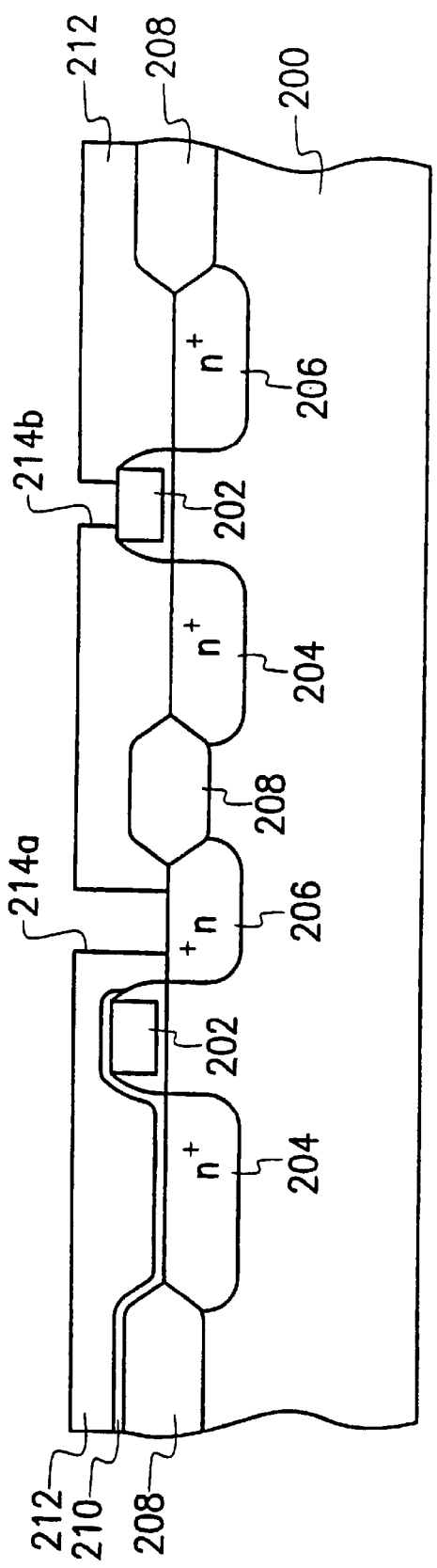
FIG. 2A
FIG. 2B

METHOD FOR AVOIDING INTERFERENCE IN A CMOS SENSOR

BACKGROUND OF THE INVENTION

1. Field of the Invention

The invention relates in general to a semiconductor manufacturing method, and more particularly to a method of forming a complementary metal oxide semiconductor (CMOS) sensor.

2. Description of the Related Art

FIG. 1 is a cross-sectional view of a portion of a semiconductor device showing a conventional complementary metal oxide semiconductor (CMOS) sensor.

In FIG. 1, the P-type well 101 is located on the substrate 100. The first oxide layer 102 and the second oxide layer 103 are located on the P-type well 101. The first oxide layer 102 and the second oxide layer 103 define the active region 104. The gate oxide layer 105 is located in the active region 104. The gate conductive layer 106 is located on the gate oxide layer 105. The first spacer 107 and the second spacer 108 are located on the side walls of the gate conductive layer 106. The first lightly doped drain region 109 and the second lightly doped drain region 110 are located below the first spacer 107 and the second spacer 108 in the P-type substrate 101. The first source/drain region 112 is located between the first lightly doped drain region 109 and the first field oxide layer 102 in the P-type substrate 101. The second source/drain region 113 is used as a depletion region.

Charge-coupled devices (CCDs) have been the mainstay of conventional imaging circuits for converting light into an electrical signal that represents the intensity of the energy. The applications of CCDs include monitors, transcription machines and cameras. Although CCDs have many strengths, CCDs also suffer from high costs and the limitations imposed by the CCDs' volume. To overcome the weaknesses of CCDs and reduce costs and dimensions, a CMOS photodiode device is developed. Because a CMOS photodiode device can be produced using conventional techniques, costs and the volume of the sensor can be reduced. The applications of CMOS photodiodes include PC cameras, digital cameras etc.

The photodiode is based on the theory that a P-N junction can convert light into an electrical signal. Before energy in the form of photons strikes the photodiode, there is an electric field in the P-N junction. The electrons in the N region do not diffuse forward to the P region and the holes in the P region do not diffuse forward to the N region. When enough light strikes the photodiode, the light creates a number of electron-hole pairs. The electrons and the holes diffuse forward to the P-N junction. When the electrons and the holes reach the P-N junction, as a result of the effect of the inner electric field across the junction, the electrons flow to the N region and the holes flow to the P region. Thus a current is induced between the P-N junction electrodes. Ideally, a photodiode in the dark is open-circuit. In other words there is no current induced by light while the photodiode is in the dark. After forming the photo diode, subsequent steps, such as forming a metal interconnect and forming an inter-layer dielectric layer, are performed to complete a photo device structure.

Inter-metal dielectric (IMD) layers or inter-layer dielectric (ILD) layers are generally used to separate and electrically isolate wiring lines and other conductors in semiconductor circuit devices. As devices are being scaled down to smaller geometries, such devices may include multiple layers of wiring lines and other conductors and require isolation between adjacent conducting structures and isolation between layers. Total thickness of the IMD layers or of the ILD layers becomes thicker than before. Thick dielectric material above the sensor region of the CMOS sensor causes interference when light passes through the dielectric material into the sensor region and decreases the sensitivity of the CMOS sensor.

SUMMARY OF THE INVENTION

The invention provides a method for avoiding interference in a CMOS sensor. A substrate at least comprising a CMOS sensor, an interconnect layer and an inter-layer dielectric layer thereon is provided. A passivation layer is formed over the substrate. A photolithography and etching process is performed to remove a part of the passivation layer and a part of the inter-layer dielectric layer above a sensor region of the CMOS sensor. The sensor region is thus exposed. An oxide layer is formed on the exposed sensor region. A micro-lens is formed on the oxide layer.

The invention uses a photolithography and etching process to expose the sensor region of the CMOS sensor. An oxide layer is formed on the sensor region so that a thickness of dielectric material above the sensor region can be controlled. A light is used to pass through the dielectric material into the sensor region while operating the CMOS sensor. The thickness of the oxide layer must be smaller than one fourth of the wavelength of the light passing through the dielectric material. Interference from the thick dielectric layer above the sensor region is thus avoided.

BRIEF DESCRIPTION OF THE DRAWINGS

Other objects, features, and advantages of the invention will become apparent from the following detailed description of the preferred but non-limiting embodiments. The description is made with reference to the accompanying drawings in which:

FIGS. 2A to 2E are schematic, cross-sectional views showing the process steps of one preferred embodiment of the method of avoiding interference of a CMOS sensor.

DESCRIPTION OF THE PREFERRED EMBODIMENT

Figure 1:
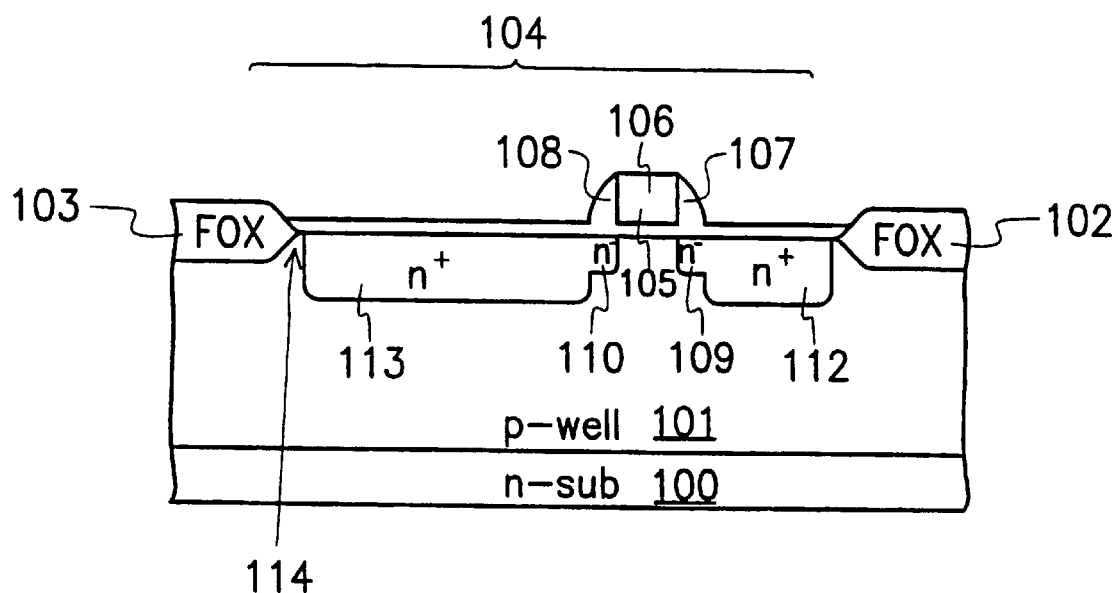
FIG. 1 is a schematic, cross-sectional view of a portion of a semiconductor device showing a conventional complementary metal oxide semiconductor (CMOS) sensor.

FIGS. 2A to 2E are schematic, cross-sectional views showing the process steps of one preferred embodiment of the method for avoiding interference in a CMOS sensor.

In FIG. 2A, a substrate 200 is provided. For example, a conductive type of the substrate 200 is P-type. The substrate 200 also can be a P-type or N-type substrate comprising a P-well. CMOS transistors are formed on the substrate 200. Each of the CMOS transistors at least comprises a gate 202 and source/drain regions 204/206. An isolating structure 208, such as field oxide (FOX) or shallow trench isolation (STI), is also formed on the substrate 200 to isolate the CMOS transistors from each other.

In FIG. 2B, an etching stop layer 210 is formed and defined over one source/drain region 204 and the gate 202 of one of the CMOS transistors. A material of the etching stop layer 210 has a large etching selectivity with respect to dielectric material. The source/drain region 204 covered by the etching stop layer 210 is used as a sensor region 204.

An inter-layer dielectric layer 212 is formed on the structure described above. The inter-layer dielectric layer 212 has contact openings 214a and 214b which either expose one of the source/drain regions 204/204 or expose the gate 202.

Figure 2C:
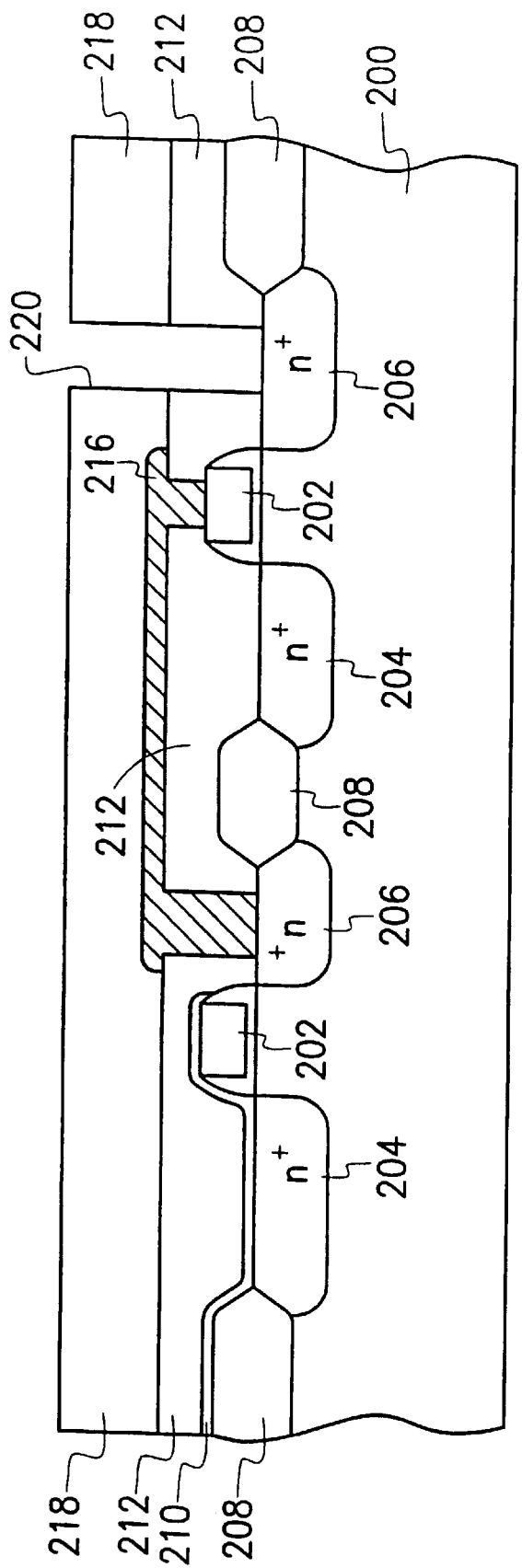

In FIG. 2C, a first metal layer 216 is formed and defined on the inter-layer dielectric layer 212. The first metal layer 216 electrically couples with the exposed source/drain regions 204/206 or with the gate 202 through the contact openings 214a and 214b (FIG. 2B). An inter-metal dielectric layer 218 is formed on the first metal layer 216 and over the inter-layer dielectric layer 212. A contact opening 220 is formed within the inter-metal dielectric layer 218 and within the inter-layer dielectric layer 212 to expose another of the source/drain regions 204/206. Furthermore, vias may be formed within the inter-metal dielectric layer 218 to expose a part of the first metal layer 216.

Figure 2D:
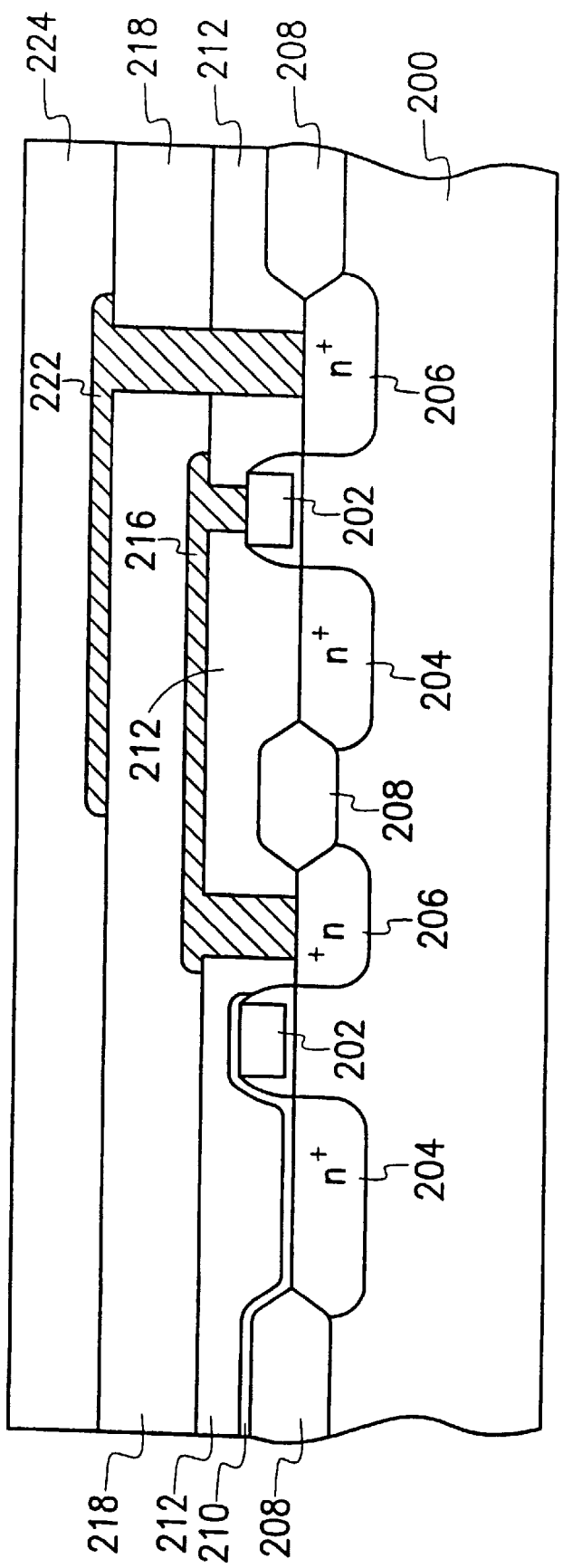

In FIG. 2D, a second metal layer 222 is formed and defined on the inter-metal dielectric layer 218. The second metal layer 222 electrically couples with the substrate 200 through the contact opening 220. A passivation layer 224 is formed on the second layer 222 and over the inter-metal dielectric layer 218 to protect structures below the passivation layer 224.

Figure 2E:
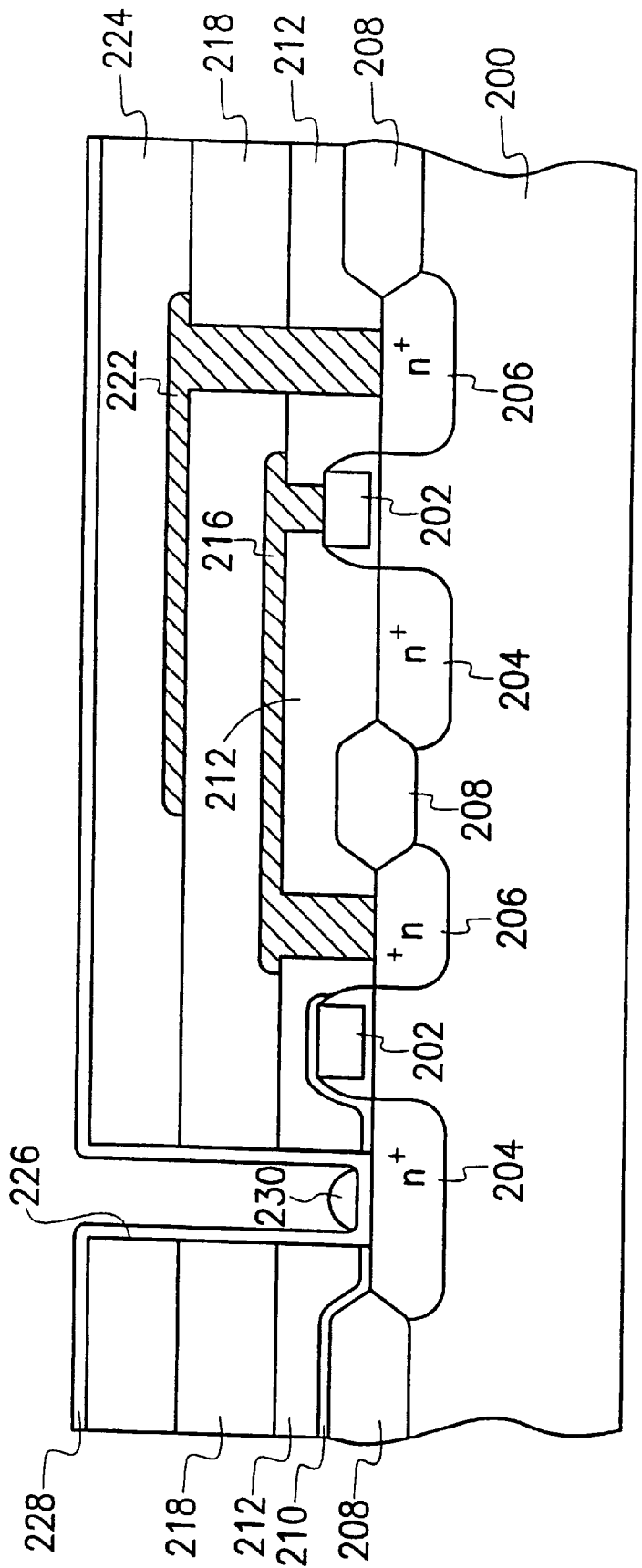

In FIG. 2E, a part of the passivation layer 224, a part of the inter-metal dielectric layer 218 and a part of the inter-layer dielectric layer 212 are removed until exposing the etching stop layer 210 is exposed. A contact opening 226 is thus formed. Since the etching stop layer 210 and dielectric material have a large etching selectivity, the etching step is stopped on the top surface of the etching stop layer 210. The substrate 200 can thus be protected from being damaged in the etching step. After forming the contact opening 226, the etching stop layer 210 is removed to expose the sensor region 204.

A conformal oxide layer 228 is formed on the sensor region 204 and on the passivation layer 224. For example, the oxide layer 228 is formed by plasma enhanced chemical vapor deposition (PECVD). A micro-lens 230 is formed on the oxide layer 228 positioned on the sensor region 204 to focus an incident light into the sensor region 204. A preferred thickness of the oxide layer 228 is about one fourth of the wavelength of the incident light. For example, if the incident light is a visual light with wavelength of about 4000–7000 Å, the thickness of the oxide layer 228 is about 0–1000 Å.

The invention provides a method for avoiding interference in a CMOS sensor. A thickness of dielectric material above the sensor region can be controlled. An incident light passes through the dielectric material into the sensor region while operating the CMOS sensor. The thickness of the oxide layer must be smaller than one fourth of the wavelength of the incident light passing through the dielectric material. Interference from a thick dielectric layer above the sensor region is thus avoided.

It should notice that the conductive type of the substrate in the preferred embodiment is P-type. The substrate also can be a N-type substrate or a substrate comprising a P-well.

While the invention has been described by way of example and in terms of a preferred embodiment, it is to be understood that the invention is not limited thereto. To the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method for avoiding interference in a complementary metal oxide semiconductor sensor, wherein a source/drain region of the complementary metal oxide semiconductor is used as a sensor region, and a dielectric layer and a passivation layer are formed over the complementary metal oxide semiconductor, comprising the steps of:

performing a photolithography and etching process to remove a part of the passivation layer and the dielectric layer to expose the sensor region;

forming an oxide layer on the exposed sensor region; and forming a micro-lens on the oxide layer.

2. The method according to claim 1, wherein the oxide layer is formed by plasma enhanced chemical vapor deposition.

3. The method according to claim 1, wherein a thickness of the oxide layer is about 0–1000 Å.

4. The method according to claim 1, wherein a thickness of the oxide layer is about one fourth of a wavelength of light passing through the oxide layer.

5. A method of forming a complementary metal oxide semiconductor sensor, comprising the steps of:

providing a substrate;

forming a metal oxide semiconductor on the substrate, wherein a source/drain region of the metal oxide semiconductor is used as a sensor region;

forming a inter-layer dielectric layer over the metal oxide semiconductor;

forming a first metal layer on a part of the inter-layer dielectric layer to electrically couple with another source/drain region of the complementary metal oxide semiconductor;

forming an inter-metal dielectric layer over the first metal layer and over the inter-layer dielectric layer;

forming a second metal layer on a part of the inter-metal dielectric layer;

forming a passivation layer over the second metal layer and over the inter-metal dielectric layer;

removing a part of the passivation layer, a part of the inter-metal dielectric layer and a part of the inter-layer dielectric layer to expose the sensor region;

forming an oxide layer on the exposed sensor region; and forming a micro-lens on the oxide layer.

6. The method according to claim 5, wherein the oxide layer is formed by plasma enhanced chemical vapor deposition.

7. The method according to claim 5, wherein a thickness of the oxide layer is about 0–1000 Å.

8. The method according to claim 5, wherein a thickness of the oxide layer is about one fourth of a wavelength of light passing through the oxide layer.

9. A method of forming a complementary metal oxide semiconductor sensor, comprising the steps of:

providing a substrate;

forming a metal oxide semiconductor on the substrate, wherein a source/drain region of the metal oxide semiconductor is used as a sensor region;

forming an etching stop layer on the sensor region;

forming an inter-layer dielectric layer over the metal oxide semiconductor;

forming a first metal layer on a part of the inter-layer dielectric layer to electrically couple with another source/drain region of the complementary metal oxide semiconductor;

forming a inter-metal dielectric layer over the first metal layer and over the inter-layer dielectric layer;

forming a second metal layer on a part of the inter-metal dielectric layer;

forming a passivation layer over the second metal layer and over the inter-metal dielectric layer;

removing a part of the passivation layer, a part of the inter-metal dielectric layer and a part of the inter-layer dielectric layer until exposing the etching stop layer;

removing the etching stop layer;

forming an oxide layer on the exposed sensor region; and forming a micro-lens on the oxide layer.

10. The method according to claim 9, wherein a material of the etching stop layer comprises silicon nitride.

11. The method according to claim 9, wherein the oxide layer is formed by plasma enhanced chemical vapor deposition.

12. The method according to claim 9, wherein a thickness of the oxide layer is about 0–1000 Å.

13. The method according to claim 9, wherein a thickness of the oxide layer is about one fourth of a wavelength of light passing through the oxide layer.

* * * * *